United States Patent [19]

Sigel et al.

[11] 4,005,651
[45] Feb. 1, 1977

[54] APPARATUS FOR ORIENTING PATTERNS PROVIDED ON MASKS FOR SERIGRAPHY

[75] Inventors: Pierre Louis Sigel, Villeneuve-le-Roi; Karel Gaston Kurzweil, Eaubonne, both of France

[73] Assignee: Societe Honeywell Bull (Societe Anonyme), Paris, France

[22] Filed: Feb. 10, 1975

[21] Appl. No.: 548,215

Related U.S. Application Data

[63] Continuation of Ser. No. 350,549, April 2, 1973, abandoned.

[30] Foreign Application Priority Data

Apr. 25, 1972  France .............................. 72.14643

[52] U.S. Cl. .......................... 101/127.1; 33/184.5; 101/128.1; 101/DIG. 12
[51] Int. Cl.[2] ......................................... B41F 15/36
[58] Field of Search ....... 101/114, 115, 126, 127.1, 101/128.1, 123, 124, 407 R, 407 BP; 33/184.5, 180 R

[56] References Cited
UNITED STATES PATENTS

| | | | |
|---|---|---|---|
| 3,192,844 | 7/1965 | Szasz et al. | 33/184.5 |
| 3,220,331 | 11/1965 | Evans et al. | 33/184.5 |
| 3,288,063 | 11/1966 | Bungay, Jr. | 101/DIG. 12 |

Primary Examiner—Edgar S. Burr
Assistant Examiner—R. E. Suter
Attorney, Agent, or Firm—Cameron, Kerkam, Sutton, Stowell & Stowell

[57] ABSTRACT

An apparatus for orienting patterns supported by a silk screen which is advantageously employed in producing multi-layer printed circuits.

The screen and the screen carrying frame are mounted into a support and displaced with respect to it so that markers outside of the patterns come to coincide with reference patterns.

7 Claims, 6 Drawing Figures

APPARATUS FOR ORIENTING PATTERNS PROVIDED ON MASKS FOR SERIGRAPHY

This is a continuation of application Ser. No. 350,549, filed Apr. 2, 1973, now abandoned.

BACKGROUND OF THE INVENTION

The object of the present invention is to provide an apparatus for orienting patterns carried by masks, intended especially, but not exclusively, for the production by serigraphy of connector circuits of thick multiple layers, called multilayer circuits, and a device for performing the process.

The development of printed circuits is known to have resulted in the study of connection means for these circuits. Practically, such connection means have to consist of a large number of conductors, distributed over a very small surface with, certain conductors being, for example, 100 microns in width. One method of designing these connections consists of the application of multilayer circuits, in which the conductors are distributed over laminae, insulated one from the other, except at certain fixed points. The problem that is resolved by the present invention is that of the exact positioning of the conductors, one in relation to the other distributed over the varius layers.

The manufacture of printed circuits of the multilayer type having thick layers is generally as follows: Each configuration desired is achieved by application, through a mask or screen, of a layer substance, which is either conductive or insulating, on an insulating substrate, which may be, for example, alumina. After each application of a layer, the substrate is removed from serigraphy apparatus and placed into a furnace at an elevated temperature (for example, on the order of 1,000°) which depends, of course, on the type of substrate and layer. During this operation, the pasty layer solidifies, due to the removal of the solvents, and only a layer of metallic or insulating characteristics remains, strongly adhering to the substrate or to the preceding layer. The complete multilayer circuit is obtained by a series of such operations. It is absolutely essential that the position of the configurations, one in relation to the other, be very exact or else the connections between the layers would not be achieved.

By a known technique, the screens are stretched over a frame and coated with a photosensitive resin which is subjected to a partial insulation such that the resin is removed in certain places, thus forming a pattern for printing. The mask obtained in this manner is mounted on a serigraphy machine and the substrate, placed underneath the screen, receives the paste only through the transparent configuration of the screen. In a known device, the frame is inserted on two prongs which provide for its exact positioning in relation to the machine. Still, the photography does not permit one to accomplish a sufficiently exact positioning of the cliche (transparent configuration) in relation to the borders of the screen in the application, which is intended here, such that the adjustment, preceding the fabrication of the multilayer circuits, requires a good deal of time.

The superposition of different layers, therefore, involves a certain number of risks, which are intolerable in industrial production. It is the object of the present invention to remedy these shortcomings.

SUMMARY OF THE INVENTION

According to the invention, the apparatus for orienting patterns supported by masks that are equipped with openings intended to cooperate with the prongs of the machine, is characterized in that an identical set of markings outside the pattern is formed on each mask, the latter being mounted freely on a support. Said support is then immobilized by two prongs on the apparatus supporting a set of reference patterns, the mask being then shifted in relation to the support in such a way that said markings fall in coincidence with said reference patterns, and is solidly attached to the support such that the position of the support then determines the position of the pattern.

Since it is difficult to attain a sufficiently accurate positioning of the transparent pattern in relation to the frame of the screen, the advantage of the apparatus according to the invention consists in the very precise positioning of the configuration in relation to an additional support in such a fashion that the position of each configuration in relation to the support, and more accurately, in relation to two bore holes of the latter, is exactly defined, (with the precision on the order of about 10 microns). In view of the fact that the position of the different supports on the serigraphy machine can be perfectly well defined, the various layers applied by means of the screens mounted on the support, containing varied patterns, are in exact superposition. The apparatus of the invention includes a plate bearing means for the maintenance and the positioning of the above cited support, means for the shifting of the mask in relation to said support, and a set of reference patterns.

It is thus possible to accomplish an exact positioning of the different patterns, in a very short time.

BRIEF DESCRIPTION OF THE DRAWINGS

Other characteristics and advantages of the invention will evolve in the course of the following description, of a special type of design, with respect to the illustrations in which.

DESCRIPTION OF THE PREFERRED EMBODIMENT

Figure 1:
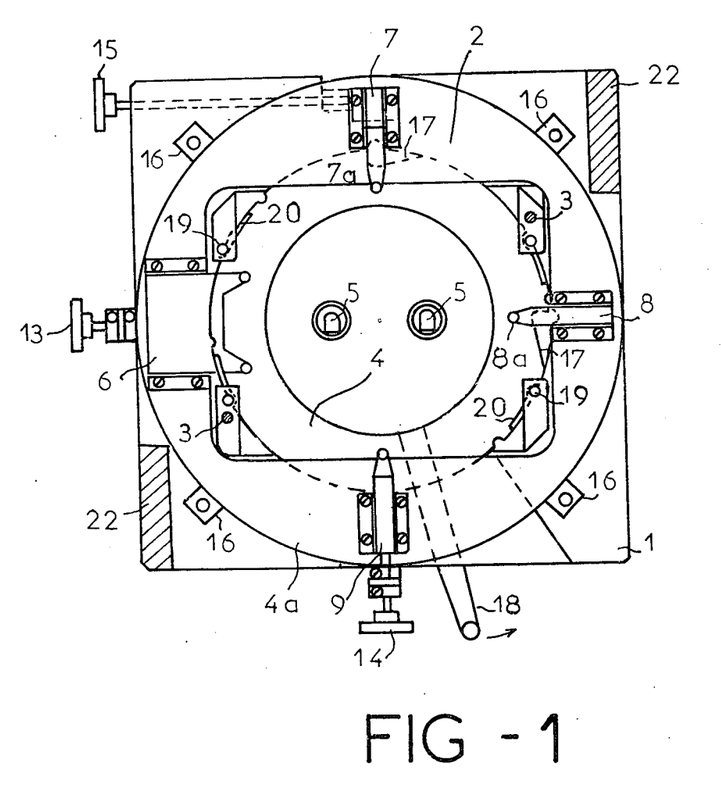
FIG. 1 is a top plan view partially is section of the positioning device.

The positioning apparatus, shown in FIG. 1, includes a plate 1 equipped with positioning prongs 3 and a pivoting ring 4. A second ring 2 is capable of turning more than several degrees around the plate axis. The interior of the plate 1 is hollow for the entering of two light sources 5, covered by a diffusor screen. The luminous sources are placed roughly opposite the optical axes of microscopes which appear on the following illustrations. They may be, for example, two small electric bulbs.

The screen 10, its frame 11 and the support 12, in which the assembly of frame and screen will be mounted, (represented in FIG. 4), are installed on the plate at the beginning of the operation by means of the two prongs 3, which cooperate with corresponding bore holes 26 provided in the support 12. In this manner the support 12 is firmly attached to the plate 1 during the entire duration of the operation.

The screen 10 and the frame 11, by contrast, may be displaced in the interior of the support 12 so that the pattern takes on a set position in relation to the axes of the prongs 3. The displacement of the frame 11 is effected by action of 4 push buttons with the reference markings 6, 7, 8, and 9, 7, and 8, being more accurately counter-pushbuttons.

The push button 6, controlled by a fine gauge screw with knurled head 13 permits the shifting of the screen in the horizontal direction, as shown in the illustration, or more generally, in accordance with a direction, termed X. The push button 9, controlled by the screw with knurled head 14. permits the displacement of the screen in a direction perpendicular to the just defined direction, or direction Y. The combination of these two translation movements makes it possible to attain all positions of the screen 10 in relation to the support 12 within a certain range of displacements, defined by the path of the push buttons. It must be clearly understood that the pattern 30 carried by the screen 10 (FIG. 4); is as accurately centered as the photography permits it to be, in relation to the rims of the frame 11, and that the device allows for correction of the shifting on the order of a few millimeters.

It may be equally necessary, however, to produce a rotation of the configuration with respect to the support 12 so that the markings 31 and 32 (FIG. 4), one of which is, for example, a cross and the other a horizontal stroke, (to define an origin and a direction) come to coincidence with the reference patterns which consist of cross hairs placed in the eye piece of the microscopes. Such a rotational movement, whose extent is a maximum of 5°, for example, may be accomplished by the action of the screw with the knurled head 15 which acts laterally on the push button 7 so as to cause the moveable ring 2 to turn in the guides 16.

The counter-push-buttons 7 and 8 which are not controlled by screws have springs which press the heads 7a, and 8a against the edges of the frame 11.

To enable the screen mounted on the support to engage in the apparatus, the push buttons must be able to take on an unlocked position. The necessary withdrawal movement is effected by action of the axes, in solid connection with the heads 7a, and 8a of the counter-push buttons, against two cams 17 which bring about the withdrawal of the heads 7a and 8a when the moveable plate is shifted through a substantial angle. This movement is controlled by a handle 18. It must be clearly understood that the precision of the positioning of the configuration attained on the screen in relation to the bore holes 26 of the support depends on the precision achieved in the position of the support in relation to the reference patterns, that is, the precision of the mounting of the support on the positioning apparatus. As mentioned above, the positioning of the support is effected by insertion of the latter on the two prongs 3.

The manufacturing tolerances for the openings cooperating with the prongs are of the order of a few microns. The result is a very accurate mounting on the prongs and the impossibility of lifting the support out by hand.

For this purpose, an automatic ejection mechanism for the support has been provided, which consists of 4 removeable studs 19 protruding under the action of the handle 18, simultaneously with the movement of withdrawal of the heads of the counter-push-buttons 7 and 8. The movement of protrusion is accomplished by the reach of the lower end of the studs 19 to the helicoidal slopes 20, formed on the plate 4. There are 4 studs to effect a good distribution of the extraction effort.

The withdrawal movement of the heads of the counter-push-buttons and the protrusion movement of the studs are simultaneous such that during the entering of the assembly 10, 11, and 12 into the apparatus, the support rests on the studs 19 and then inserts itself on the two prongs due to the action of the handle 18. At the same time, the heads of the push buttons 6, 7, and 9 come into contact with the edges of the screen. At this moment, the displacement of the frame in relation to the support occurs by the operator acting on the knurled buttons 13, 14 and 15 which aligns the exterior markings 31 and 32 of the pattern with the reference patterns.

When this alignment is completed, the frame is immobilized on the support, as will be described hereafter, then the device is unlocked by the handle 18 which causes the ejection of the frame from the prongs.

Figure 2:
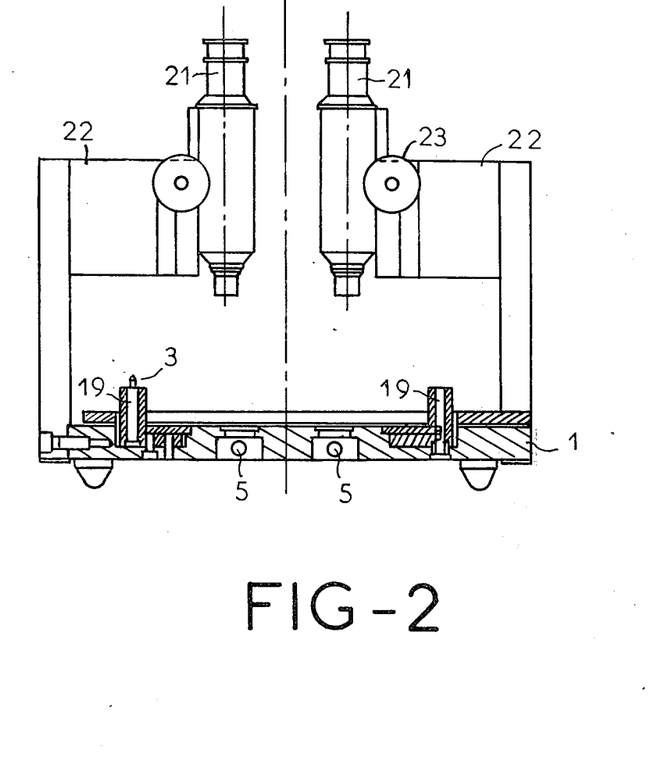
FIG. 2 is an elevational view of the same device.
Figure 3:
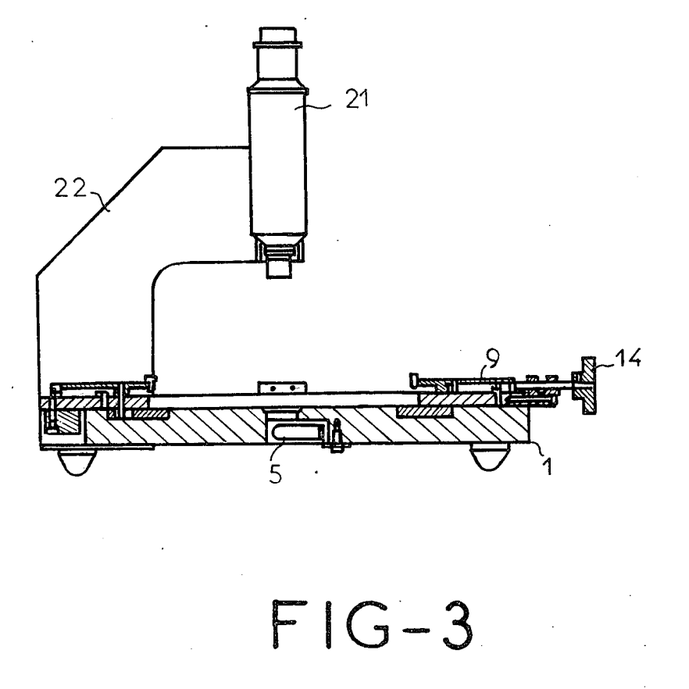
FIG. 3 is another elevational view.

FIG. 2 represents the positioning apparatus, viewed from the side, in a section. The reference characters of FIG. 1 have been maintained for identical elements. Two microscopes 21 are resting on two consoles 22. Cross hairs having an identical shape as that of the markings on the mask are installed in the eye pieces, said cross hairs being then located in the focus of the eye pieces and thus aligned with the optical axes of the microscopes. It is essential that the positioning of the microscopes in relation to the prongs 3 which affects the eventual positionings must be adjusted with utmost precision and, in particular, must have the ability to be repeated after having been dissasembled for reasons of maintenance, so that all patterns placed on the machine must be capable of being superimposed. For this purpose, the position of the microscopes in relation to the prongs is preferably determined with the aid of an adjustment gauge which is applied after disassembling of the apparatus. The setting of each microscope is effected by means of the knurled button 23. In this figure, the studs 19 may be seen which, in the rest position, are within the centering base. FIG. 3 exhibits another lateral view of the apparatus, showing more particularly the form of a console 22.

Figure 4:
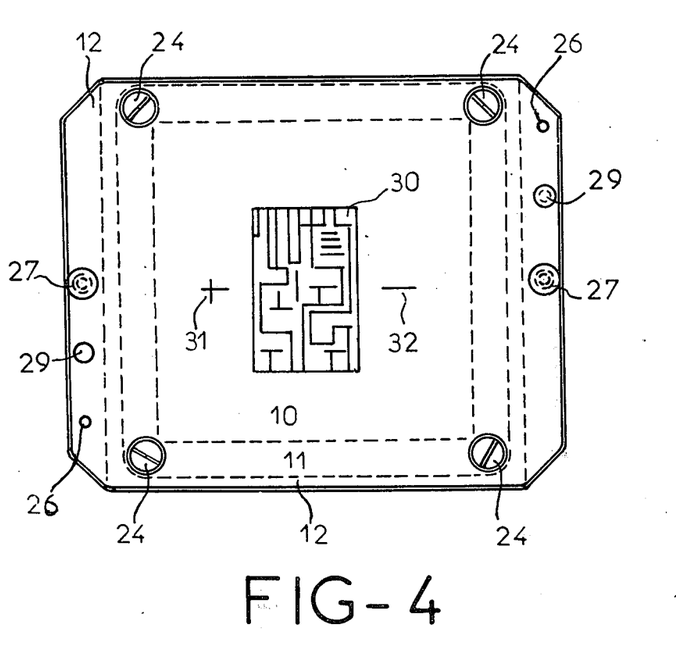
FIG. 4 is a top plan view of the screen, its frame, and the support.
Figure 5:
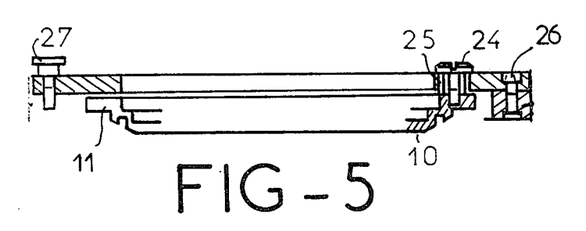
FIG. 5 is an elevational view of the assembly illustrated in FIG. 4.

FIGS. 4 and 5 illustrate the assembly mask or screen 10, frame 11, and support 12. In FIG. 1 the means are described that come into play to shift the screen in relation to the support 12. It goes without saying that once the exact position has been achieved, it is important to have the screen fixed in a good position in relation to the support. This is done in the following manner.

The frame 11 is firmly attached to the support 12 by 4 flat-headed screws 24 which are milled. These screws rest with the lower part of their head on the upper face of the support and penetrate a bore hole 25 of a diameter greatly exceeding the diameter of their body, before they screw into the frame 11. During the entering of the support into the apparatus, the screws have the function of maintaining the frame and the screen, but are not locked so as to provide the necessary air space between the frame and the support. When the correct position of the screen has been accomplished by the action of the means, described above, the screws are locked and the frame is in solid connection with the support, for the further serigraphy operations. The free space of the screw body 24 across the bore holes 25, makes possible the displacement of the edges of the frame 11 in relation to the borders of the support 12.

Since these prongs are delicate and would run the risk of deformation, the position of the frame on the machine is, on the other hand, secured and reinforced by two screws 27 which are screwed onto the machine, during the serigraphy operations. Since it is not feasible to provide an ejection device on the serigraphy machine similar to that of the positioning device, two screws 29 have been provided of which only the thread is represented in FIG. 4. These screws resting on the border of the serigraphy machine (not shown), permit one to lift out the support by turning the screws, also the frame and the screen from the prongs of the machine, without damaging them. The transparent pattern 30 takes up roughly the screen center. 10 and is surrounded by two markings, of which one 31 constitutes a cross and the other 32 a dash. It is self-understood that other markings may be used. The application of two different markings is justified to avoid the risk of the reversal of direction.

Figure 6:
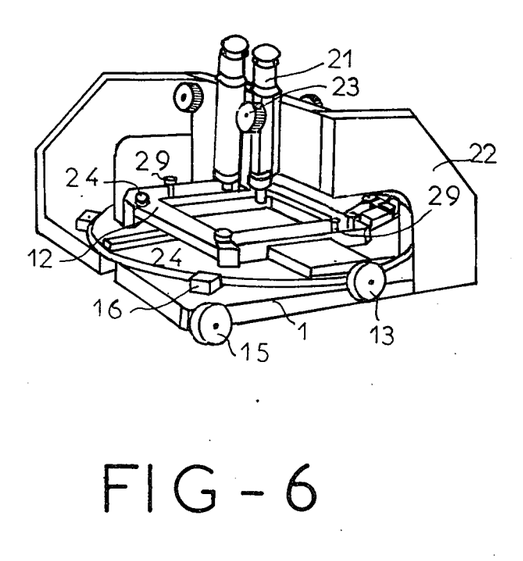
FIG. 6 is a perspective view of the positioning device.

FIG. 6 is a perspective view of the positioning device, on a reduced scale. The extraction screws 29 cooperate with threads bearing the same reference numerals (see FIG. 4). Screws 29 are use to lift the support 12 and the screen 10 out of the machine so that the support and screen may be employed, for example, in the production, by serigraphy, of multi-layer connector circuits. The L form or shape of the microscope supports is intended to facilitate the entering and extracting of the support on the device, and to facilitate the locking of the screws 24.

Obviously, the example of application of the process according to the invention to the superimposition of patterns, obtained by serigraphy, is not limitative, and the process and device similar to that which was just described may be utilized in each case where very accurate positioning of a pattern, each one in relation to the other, is involved. It is self-understood that other methods of positioning, of fixation and of marking the pattern and the screen on the support may be employed without thereby departing from the framework of the invention.

OPERATION

At the beginning of the operation, the handle 18 of the positioning apparatus is manually operated to cause a withdrawal movement of the heads 7a and 8a and, simultaneously, a protrusion movement of the studs 19. Moreover, the frame 11 which carries the screen 10 is mounted on the support 12 by means of the four screws 24, but the latter are not locked in order to permit the frame to be displaced in relation to the support. Then, this support 12 is installed on the studs 19 of the apparatus in such a manner that the bore holes 26 are just above the positioning prongs 3 of the plate 1. Afterwards, the handle 18 is operated in reverse direction to cause a withdrawal movement of the studs 19. In the course of this movement, the prongs 3 fit into the bore holes 26, and thus a precise positioning of the support 12 in relation to said prongs is obtained. Simultaneously, the heads of the push buttons 6, 7, 8 and 9 come into contact with the frame 11. Thereafter, the operator, while looking through the microscopes 21, acts on the knurled buttons 13, 14 and 15, in order to shift the frame 11 in relation to the support until the markings 31 and 32 of the screen come to coincide with the reference patterns which are installed in the eye pieces of the microscopes. The screws 24 are then locked so that the frame is in solid connection with the support. Finally, the handle 18 is again operated to cause, on one hand, the withdrawal movement of the heads 7a and 8a, and, on the other hand, the protrusion movement of the studs 19 which then lift the support 12 so that the latter is set free from the prongs 3.

What is claimed is:

1. An improved support for orienting a pattern provided on a mask with respect to the frame on which the mask is mounted with a reference pattern provided on a supporting alignment base having at least two prongs mounted on the base and projecting from the base, the prongs each having a longitudinal central axis and being positioned so that their longitudinal central axes are a predetermined distance from said reference pattern and from each other comprising:

support means for mounting a mask, said mask having a pattern and a marking thereon, said support means including apertures to be selectively positioned on and removed from the prongs on the base and a frame to support said mask to the support in a fixed, predetermined position with respect to the base and with respect to the base reference pattern, said frame being selectively movable with respect to the support such that the marking on the mask may be brought into alignment with the reference pattern;

means for moving said frame with respect to the support to effect said alignment;

means for locking the position of the frame with respect to the support after the marking on the mask has been brought into alignment with the reference pattern, whereby said mask support means may then be removed from the base and may thereafter be employed in the production, by serigraphy, of multi-layer connector circuit.

2. The improved apparatus described in claim 1 wherein the means for moving the frame with respect to the support means includes two push buttons and two counter-push buttons disposed to shift the frame in two orthogonal directions and to contact the edges of the frame for movement of the frame in orthogonal directions in a horizontal plane and a further adjustment means for adjustably rotating said frame with respect to said plane a limited extent not exceeding 5°.

3. An improved apparatus for orienting a pattern provided on a mask with respect to the frame on which the mask is mounted, comprising:

a base;

means for providing a reference pattern mounted on the base;

at least two prongs mounted on the base and projecting from the base, the prongs each having a longitudinal central axis and being positioned so that their longitudinal central axes are a predetermined distance from the reference pattern and from each other;

means for mounting a mask, said mask having a pattern and a marking thereon, said mask mounting means including a support to be selectively supported on and removed from the prongs on the base and a frame to support said mask, said support having a plurality of apertures to receive said prongs therein and support the support on the base in a fixed, predetermined position with respect to the base and with respect to the reference pattern, said frame being selectively movable with respect to the support such that said marking on the mask may be brought into alignment with the reference pattern;

means for moving said frame with respect to the support to effect said alignment;

means for locking the position of the frame with respect to the support after the marking on the mask has been brought into alignment with the reference pattern whereby said mask mounting means may then be removed from the base and may thereafter be employed in the production, by serigraphy, of multi-layer connector circuits.

4. The improved apparatus described in claim 3 wherein the means for providing said reference pattern includes at least one microscope having an eye piece and an optical axis and having cross bars in the eye piece, which cross bars are aligned with the optical axis, of the microscope; and wherein the microscope is positioned, with respect to the base, so that the optical axis of the microscope is positioned a preselected distance from the longitudinal central axis of each of the prongs.

5. The improved apparatus described in claim 3 including means for removing the mask mounting means from the base.

6. The improved apparatus described in claim 3 including means for moving the frame with respect to the support said means comprising adjustable push buttons and counter-push buttons, disposed to shift the frame in two orthogonal positions.

7. The improved apparatus described in claim 6 wherein the means for moving the frame with respect to the support further includes means for rotating the frame a limited extent not to exceed 5°.

* * * * *

UNITED STATES PATENT OFFICE
CERTIFICATE OF CORRECTION

Patent No. 4,005,651     Dated February 1, 1977

Inventor(s) Sigel et al.

It is certified that error appears in the above-identified patent and that said Letters Patent are hereby corrected as shown below:

[63] "April 2, 1973" should be --April 12, 1973--.

Signed and Sealed this

Twenty-eighth Day of June 1977

[SEAL]

Attest:

RUTH C. MASON
Attesting Officer

C. MARSHALL DANN
Commissioner of Patents and Trademarks